US008981981B1

United States Patent
Mossawir

(10) Patent No.: US 8,981,981 B1
(45) Date of Patent: Mar. 17, 2015

(54) DIGITAL-TO-ANALOG CONVERTER WITH MONOTONICITY

(71) Applicant: Google Inc., Mountain View, CA (US)

(72) Inventor: Benjamin Joseph Mossawir, Mountain View, CA (US)

(73) Assignee: Google Inc., Mountain View, CA (US)

( * ) Notice: Subject to any disclaimer, the term of this patent is extended or adjusted under 35 U.S.C. 154(b) by 0 days.

(21) Appl. No.: 13/838,735

(22) Filed: Mar. 15, 2013

(51) Int. Cl.
  *H03M 1/66* (2006.01)
(52) U.S. Cl.
  CPC ...................................... *H03M 1/66* (2013.01)
  USPC ............................ 341/144; 341/145; 341/153
(58) Field of Classification Search
  CPC ..... H03M 1/747; H03M 1/745; H03M 1/687; H03M 1/0863; H03M 1/74; H03M 1/0665; H03M 1/66
  USPC .......................................... 341/144, 145, 153
  See application file for complete search history.

(56) References Cited

U.S. PATENT DOCUMENTS

| 5,243,347 | A | 9/1993 | Jckson et al. | |
|---|---|---|---|---|
| 6,724,334 | B2 * | 4/2004 | Tzelnick | 341/144 |
| 7,161,513 | B2 * | 1/2007 | Werner et al. | 341/119 |
| 7,414,561 | B1 | 8/2008 | Brubaker | |
| 8,164,495 | B2 | 4/2012 | Agi | |
| 2005/0035893 | A1 * | 2/2005 | Horsky et al. | 341/153 |
| 2005/0116851 | A1 * | 6/2005 | Clara et al. | 341/144 |
| 2005/0270209 | A1 * | 12/2005 | Tseng | 341/144 |
| 2006/0114138 | A1 * | 6/2006 | Eloranta | 341/144 |
| 2007/0090981 | A1 * | 4/2007 | Chou | 341/144 |
| 2009/0251347 | A1 * | 10/2009 | Yang | 341/144 |
| 2011/0156935 | A1 | 6/2011 | Zhao et al. | |

* cited by examiner

*Primary Examiner* — Linh Nguyen
(74) *Attorney, Agent, or Firm* — Morris & Kamlay LLP

(57) ABSTRACT

Systems and methods provide for the control of a fully-segmented digital-to-analog converter. The selected lead-most current cell of an array in the digital-to-analog converter is addressed individually using a row/column scheme and a decoder. The remaining current cells behind the lead-most current cell are enabled via a ripple enable signal that propagates backwards from the lead-most current cell. The ripple enable signal snakes through the array to enable all the current cells behind the lead-most current cell in a cell-by-cell fashion. The current cells in front of the lead-most current cell are not enabled.

19 Claims, 7 Drawing Sheets

DIGITAL-TO-ANALOG CONVERTER WITH MONOTONICITY

BACKGROUND

A digital-to-analog converter (DAC) can have individually addressable elements. Each of the individually addressable elements can have its own individual control lines. As the number of individually addressable elements increases, the impact of routing individual control lines to each cell becomes impractical. For example, in a 10-bit DAC, there are $2^{10}$ or 1024 individually addressable elements with 1024 individual control lines to each of the addressable elements. Using individual control lines can become more of a hindrance as the resolution of the DAC increases and as the area dedicated to the DAC decreases (e.g., where the DAC is configured for area-constrained applications). In addition, the routing of the individual control lines can make design considerations more complicated in view of the limited area.

Further limitations and disadvantages of conventional and traditional approaches will become apparent to one of skill in the art through the comparison of such systems with some aspects of some embodiments according to the present disclosure as set forth in the remainder of the present application with reference to the drawings.

BRIEF SUMMARY

Aspects of the disclosure relate to a digital-to-analog converter (DAC). In an example embodiment, the DAC is fully-segmented and/or area-efficient. In an example embodiment, the DAC provides a monotonic output.

An example embodiment provides a digital-to-analog converter that includes, for example, a plurality of current elements and a decoder that is operatively coupled to the plurality of current elements. The decoder selects a single current element of the plurality of current elements that causes the single current element to provide a first unit of current to the output of the digital-to-analog converter. The single current element includes circuitry that causes the single current element to select a second current element of the plurality of current elements to provide a second unit of current to the output of the digital-to-analog converter. Further selection of subsequent current elements is performed in a daisy chain sequence in which one current element is selected at a time by a previously selected current element. The daisy chain sequence is arranged over a plurality of columns and a plurality of rows.

An example embodiment provides a method of providing an output signal from a digital-to-analog converter. The method can include, for example, one or more of the following: selecting, by a decoder, a first current element in the digital-to-analog converter that enables the first current element to provide a first current; selecting, by circuitry in the first current element, a second current element in the digital-to-analog converter that enables the second current element to provide a second current; selecting other current elements in the digital-to-analog converter in a daisy chain sequence in which one current element is selected at a time by a previously selected current element, the other selected current elements being arranged over a plurality of columns and a plurality of rows and providing respective currents; and summing up the first current, the second current and the respective currents from the other selected current elements to provide an output signal of the digital-to-analog converter.

An example embodiment provides a device that includes, for example, a plurality of current elements and a decoder that is operatively coupled to the plurality of current elements. The decoder activates current elements in a subset of the plurality of current elements by selecting a single current element. Each of the activated current elements of the subset and the single current element provides a respective unit current as part of a total current of the device. The selection of the single current element causes the current elements of the subset to activate in series due to a propagation of a ripple enable signal between adjacent current elements of the subset. The ripple enable signal propagates in a single pattern that extends over a plurality of columns and a plurality of rows.

These and other advantages, aspects and novel features of the present disclosure, as well as details of an illustrated embodiment thereof, will be more fully understood from the following description and drawings.

DETAILED DESCRIPTION

Aspects of the disclosure relate to a digital-to-analog converter (DAC). In an example embodiment, the DAC is fully-segmented and/or area-efficient. The DAC can provide a monotonic output.

Figure 1:
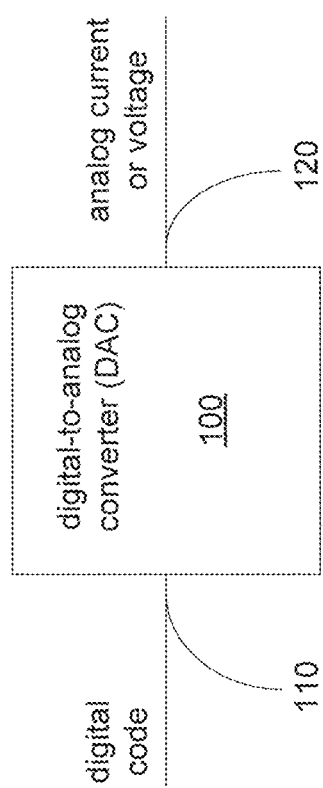
FIG. 1 illustrates an example embodiment of a digital-to-analog converter (DAC).

FIG. 1 illustrates an example embodiment of a DAC 100. The DAC 100 has one or more inputs 110 and one or more outputs 120. In an example embodiment, the one or more inputs 110 are configured to receive a code (e.g., one or more bits of a digital input and/or code). The one or more outputs 120 are configured to provide a current (e.g., an analog current) and/or a voltage (e.g., an analog voltage) that corresponds to the code received by the one or more inputs 110.

In operation, the DAC 100 receives the code at the input 110. In response to the received code, the DAC 100 provides a corresponding current (and/or voltage) on the output 120. In an example embodiment, as the code increases in discrete values, the current provided on the output 120 also increases in corresponding discrete values. As the code decreases in discrete values, the current provided on the output 120 also decreases in corresponding discrete values. Other correspondences between the code or changes in code and the corresponding currents (and/or voltages) or changes in currents (and/or voltages) are also contemplated by other example embodiments.

In an example embodiment, the DAC 100 provides monotonicity for the current provided at the output 120. Thus, in an example embodiment, the DAC 100 does not unexpectedly increase (e.g., temporarily increase) the current on the output 120 as the code transitions from an initial value to a subsequently lower value. Glitches such as a transient increase in current as the code transitions or settles from an initial value to a subsequently lower value can occur if the DAC 100 does not provide monotonicity, for example. In an example embodiment, the DAC 100 does not unexpectedly decrease (e.g., temporarily decrease) the current on the output 120 as the code transitions from an initial value to a subsequently higher value.

Figure 2:
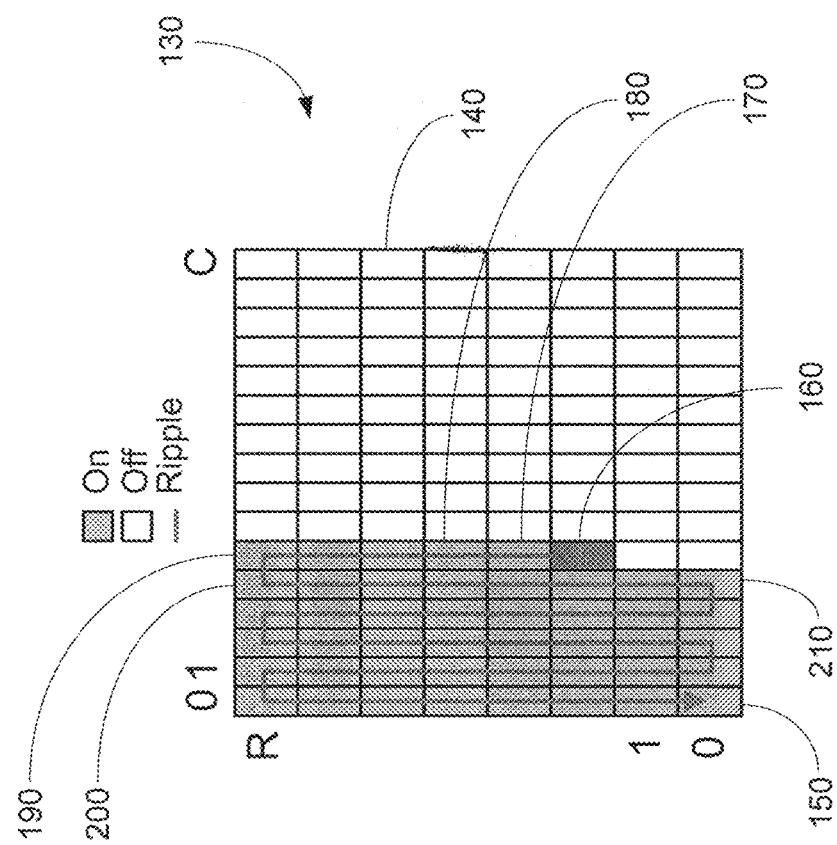
FIG. 2 illustrates an example embodiment of an array of current elements.

FIG. 2 illustrates an example embodiment of an array 130 of current elements 140 (e.g., current cells) in a fully-segmented DAC 100. The array 130 has R+1 rows and C+1 columns. Each current element 140 is individually addressed. For example, current element 150 is addressed as row 0 and column 0. In another example, current element 160 is addressed as row 2 and column 5. In an example embodiment, each current element 140 is configured to provide the same unit of current, if the respective current element 140 is turned on. The provided unit of current from current element 140 can be added to the units of current provided by the other current elements 140 that are turned on. Thus, for example, if ten current elements are turned on, then the array 130 of current elements 140 can provide ten units of combined current. In another example embodiment, the current elements 140 are configured to provide weighted or scaled units of current, which are not necessarily equal to each other, if the respective current elements 140 are turned on. If a particular current element 140 is turned off or remains off, then the particular current element 140 does not contribute current to the output of the array 130 or the DAC 100.

In operation, the code that is input to the DAC 100 is used to determine which of the current elements will be turned on. Referring to FIG. 2, the code is used to turn on the lead-most current element 160, which provides a unit of current for the output of the array 130 or the DAC 100. The lead-most current element 160 then turns on the current element 170 that is "behind" current element 160. In an example embodiment, which current element is the next current element "behind" current element 160 is hard-wired. The turned-on current element 170 provides a unit of current which is combined with the unit of current provided by the lead-most current element 160 for a summed current (e.g., two units of current) on the output of the array 130 or the DAC 100. The turned-on current element 170 turns on the current element 180 that is behind the current element 170. The process continues, in which each turned-on current element turns on the current element behind it and provides an additional unit of current for the summed current provided on the output of the array 130 or the DAC 100, until current element 150 (i.e., the "last" current element 150 in the array 130) is turned on and provides an additional unit of current for the summed current provided on the output of the array 130 or the DAC 100. The current elements 140 in "front" of the lead-most current element 160 are not turned on or remain off, and do not contribute to the sum of unit currents on the output of the array 130 or the DAC 100.

In an example embodiment, the DAC 100 can be viewed as a thermometer stack in which, for a particular setting, the lead-most cell and all the cells beneath (e.g., behind) the lead-most cell are activated (e.g., turned on).

In an example embodiment, the DAC 100 employs a unidirectional path (e.g., a "snaking" path, a "serpentine" path, a daisy chained path, a connected-in-series path, etc.) in turning on the current elements 140 behind the lead-most current element 160 as illustrated in FIG. 2. In an example embodiment, the snaking or serpentine path is hard-wired. To turn on the current elements 140 behind the lead-most current element 160, a ripple signal (e.g., a ripple enable signal) propagates between only neighbors and from one neighbor to the next. The ripple signal alerts the current element (e.g., current cell), which is directly behind the active cell, to itself become active. The operation of using the ripple signal to alert the current element, which is directly behind the active current element, to become active is performed iteratively or recursively from one current element to the next one behind until the last current element 150 is alerted to become active by the ripple signal.

In an example embodiment, the DAC 100 employs hardware, firmware and/or software to cause the ripple signal to stay in the same row upon reaching the beginning or the end of a column in the array 130. Referring to FIG. 2, current element 190 receives the ripple signal and turns on. In turn, it sends the ripple signal to current element 200 in the same row, but in a different column, and the ripple signal received by the current element 200 causes the current element 200 to turn on. The ripple signal continues to propagate from one current element to another current element (e.g., the current element that is behind the previous current element) down column 4. Once the ripple signal reaches the bottom of column 4, the ripple signal stays in the same row, but propagates to the next column (e.g., column 3) of the array 130. Then the ripple signal propagates up column 3 from one current element to another current element. The ripple signal ultimately ends at the last current element 150. In an example embodiment, the last current element 150 does not send the ripple signal further and does not turn on another current element 140.

The snaking pattern and/or the ripple signal can be useful, for example, in reducing the wire count and/or the length of the wires in the DAC 100. In an example embodiment, instead of turning on each of the current elements 140 from an external central controller (not shown in FIG. 2) in which long individual wires are employed from the external central controller, which is external to the array 130, to each of the current elements 140, the DAC 100 initially turns on one current element 140 (e.g., the current element 160) and then short wires between neighboring current elements 140 are used to carry a ripple signal to turn on the other current elements 140. In an example embodiment, each current element 140 can turn on at most one other current element 140. Thus, in an example embodiment, a short wire is used to carry the ripple signal from the current element 160 to the current element 170 instead of a long wire being used from an external central controller to the current element 170. In an example embodiment, the current element 160 can only turn on the current element 170. In addition, the snake pattern according to an example embodiment provides that the ripple signal only propagates from one current element to one neighboring current element (e.g., a nearest neighbor that is behind it). Thus, in an example embodiment, a short wire is used to carry the ripple signal from current element 190 to current element 200 instead of a long wire being used to carry a signal from current element 190 to the beginning of a new column at current element 210.

Figure 3:
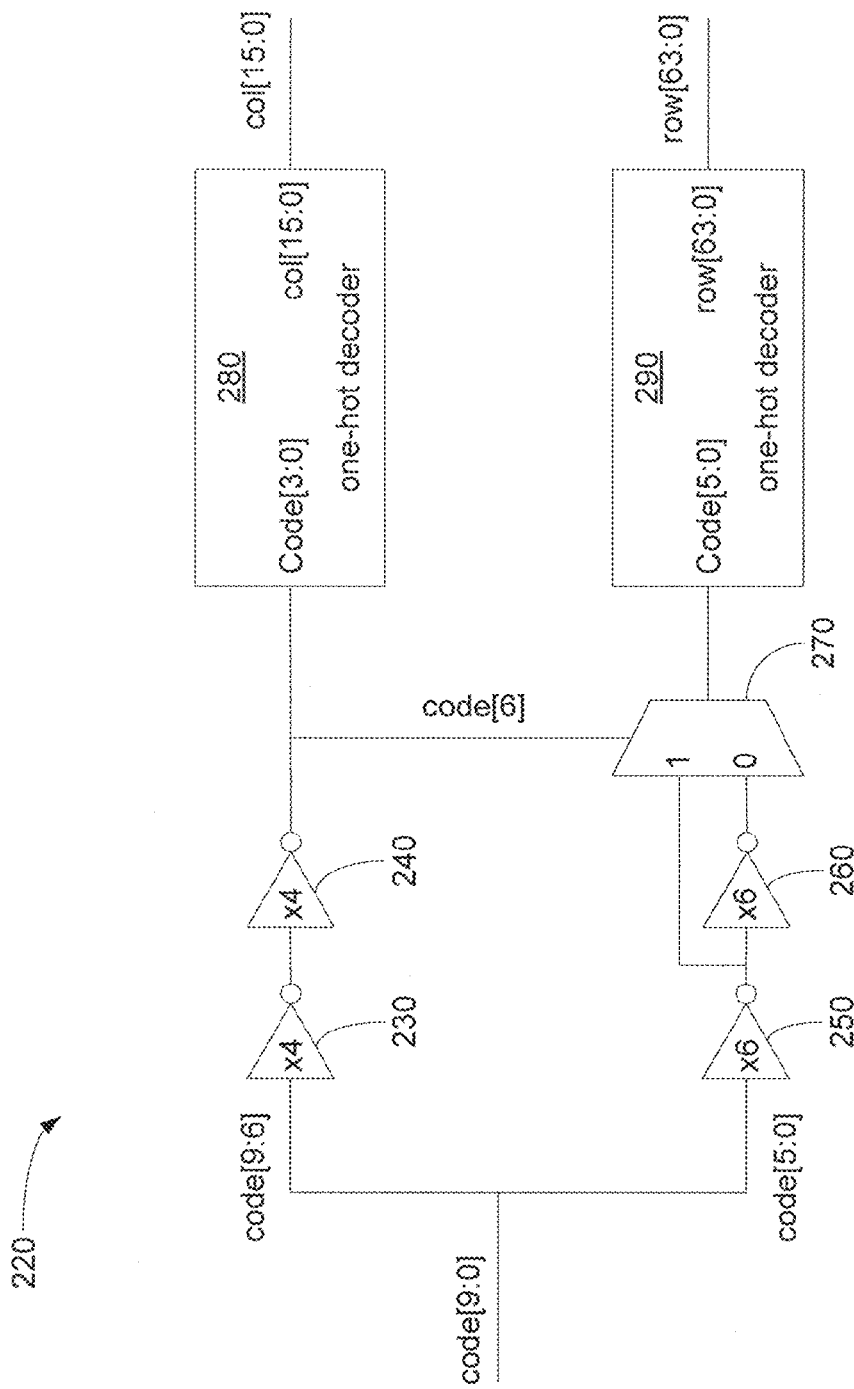
FIG. 3 illustrates an example embodiment of a decoder arrangement.

Referring to FIG. 3, when a code is input to the DAC 100, the DAC 100 employs a decoder arrangement 220 to determine which current element 140 is being addressed. In an example embodiment, the decoder arrangement 220 is also configured to implement the snake pattern of the current elements 140 when addressing current elements.

In an example embodiment, the decoder arrangement 220 includes inverters 230, 240, 250, 260 (e.g., NOT gates, inverted buffers or amplifiers, etc.), a multiplexer 270, a one-hot column decoder 280 and a one-hot row decoder 290.

In an example embodiment, the array 130 has 1024 current elements 140 arranged in sixty-four rows and sixteen columns. The code that is input into the DAC 100 is at least ten bits long so that each current element 140 can be individually addressed. Referring to FIG. 3, the ten-bit code is referenced as code[9:0] and is split into the four most significant bits, referenced as code[9:6], and the six least significant bits, referenced as code[5:0]. Code[9:6] is used as a column address to determine the column of the lead-most current element 160 and code[5:0] is used as a row address to determine the row of the lead-most current element 160.

Code[9:6] is input into the inverter 230, which can include four respective inverters for the corresponding bits of code[9:6]. The inverter 230 is then coupled to inverter 240, which can include four respective inverters for the corresponding inverted bits provided by the inverter 230. The output of the inverter 240 is coupled to the input of the one-hot column decoder 280. The output of the one-hot column decoder 280 is coupled to the array 130.

Code[5:0] is input into inverter 250, which can include six respective inverters for the corresponding bits of code[5:0]. The inverter 250 is then coupled to the inverter 260, which can include six respective inverters for the corresponding inverted bits provided by the inverter 250.

The multiplexer 270 has two inputs labeled 0 and 1, respectively. The select input is coupled to the least significant bit from the inverter 240 (e.g., the least significant bit of the column address) and has the value of code[6]. The output of the multiplexer 270 is coupled to the input of the one-hot row decoder 290. The output of the one-hot row decoder 290 is coupled to the array 130. In an example embodiment, the multiplexer 270 can include six respective multiplexers that receive the select input from the least significant bit from the inverter 240 and provide outputs to the one-hot row decoder 290.

In operation, code[9:0] is input to the DAC 100. Code[9:0] is split between row-determining circuitry and column-determining circuitry. Code[9:6] is used to determine the column of the lead-most current element 160. Code[9:6] is inverted by the inverter 230 and then inverted again by the inverter 240 before being received by the one-hot column decoder 280. The one-hot column decoder 280 uses the received bits from the inverter 240 to determine a particular column in which the lead-most current element 160 resides.

Code[5:0] is used to determine the row of the lead-most current element 160. Code[5:0] is inverted by the inverter 250 and then inverted again by the inverter 260 before being received by a first input 0 of the multiplexer 270. The inverted output of the inverter 250 is received by a second input 1 of the multiplexer 270. The multiplexer uses the least significant bit, code[6], of the code used to determine the column as a select input. If code[6] is 0, then the input 0 is carried on the output of the multiplexer 270. If code[6] is 1, then the input 1 is carried on the output of the multiplexer 270. The one-hot row decoder 290 uses the received bits from the multiplexer 270 to determine a particular row in which the lead-most current element 160 resides.

The multiplexer 270 is configured to follow the snake pattern according to an example embodiment. Referring to FIG. 3, the multiplexer 270 is configured so that as the code [9:0] increments or decrements by 0000000001 when between 0000000000 (e.g., representing the last current element of the array) to 1111111111 (e.g., representing the first current element of the array), the pattern of outputs of the one-hot decoders 280, 290 follows the snake pattern. Thus, when incrementing or decrementing by 0000000001 and when a top or a bottom of a column is reached, the next current element according to the multiplexer arrangement is in an adjacent column, but in the same row.

In an example embodiment, the one-hot decoders 280, 290 turn on only one current element, for example, the lead-most current element 160 of the plurality of current elements that provide units of current for an output of the array 130 or the DAC 100. The lead-most current element 160 provides a unit of current for the output of the array 130 or the DAC 100. The lead-most current element 160 turns on the current element 170 (e.g., the current element that is behind current element 160) by using a ripple signal (e.g., an enable or turn-on signal). In an example embodiment, the ripple signal propagates to the current element that is behind the present current element due to hard-wiring. In such a way, each of the current elements behind the lead-most current element 160 is turned on and provides a respective unit of current to the output of the array 130 or the DAC 100. The output of the array 130 or the DAC 100 is thus the sum of the units of current from the lead-most current element 160 and all of the current elements behind the lead-most current element 160. In an example embodiment, the current elements behind the lead-most current element 160 are determined by a snake pattern. In an example embodiment, the snake pattern reduces the length of wiring between subsequent current elements. In an example embodiment, only the lead-most current element 160 is turned on by the one-hot decoders 280, 290; the rest of the current elements behind the lead-most current element 160 are turned on using the ripple signal.

Figure 4:
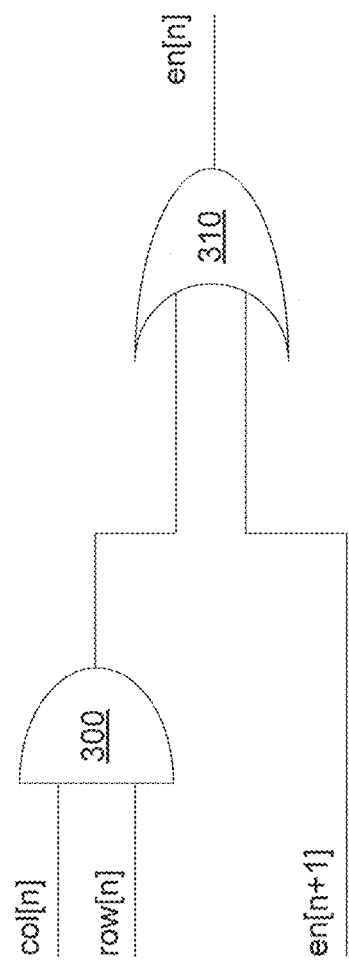
FIG. 4 illustrates an example embodiment of enabling or disabling circuitry.

FIG. 4 illustrates an example embodiment of enabling circuitry (or disabling circuitry) inside each of the current elements 140. In an example embodiment, an AND gate 300 and an OR gate 310 are coupled. The inputs of the AND gate 300 coupled to, for example, the decoder arrangement 220 (e.g., the one-hot decoders 280, 290). The inputs of the OR gate 310 are coupled to the output of the AND gate 300 and to the ripple signal (e.g., an enable signal) from the current element in front of this particular current element illustrated in FIG. 4. The OR gate 310 has an output that is coupled to the current element behind this particular current element that is illustrated in FIG. 4.

In operation, if it is determined from the decoder arrangement 220 that this particular current element illustrated in FIG. 4 is the lead-most current element 160, then the AND gate 300 outputs a logical 1. The OR gate 310 then outputs a logical 1 and the signal en[n] on the output of the OR gate 310 is a logical 1 indicating that this particular current element should be turned on or enabled. Once turned on or enabled, the particular current element provides its unit of current for the output of the array 130 or the DAC 100 and sends its high enable signal en[n] to the current element that is behind it so that the current element behind it can also be turned on or enabled.

If this particular current element is not the lead-most current element 160, then the output of the AND gate is a logical 0. In such a case, this particular current element is turned on or enabled only if it receives a logical 1 from the signal enable[n+1], which is the ripple signal from the current element in front of the particular current element illustrated in FIG. 4. In effect, if the current element in front of the particular current element illustrated in FIG. 4 is turned on, then the signal enable[n+1] will be high and the particular current element illustrated in FIG. 4 will also be turned on.

If this particular current is a current element that is somewhere in front of the lead-most current element 160 in the array 130, then neither the input from the AND gate 300 nor the input from the signal[n+1] will be high, and the output of the OR gate 310 will be low. When the output of the OR gate 310 is low, then the current element illustrated in FIG. 4 will not turn on and does not contribute to the output of the array 130 or the DAC 100. Furthermore, the low signal en[n] is passed on to the next current element behind the current element illustrated in FIG. 4 and is also not turned on. In an example embodiment, this low ripple signal causes the current elements down to the current element in front of the lead-most current element 160 to not turn on and to not contribute to the output of the array 130 or the DAC 100. As noted above, the lead-most current element 160 is not affected by the low ripple signal received on the signal en[n+1] since the AND gate 300 will have a high output that causes a high output for the OR gate 310.

Figure 5:
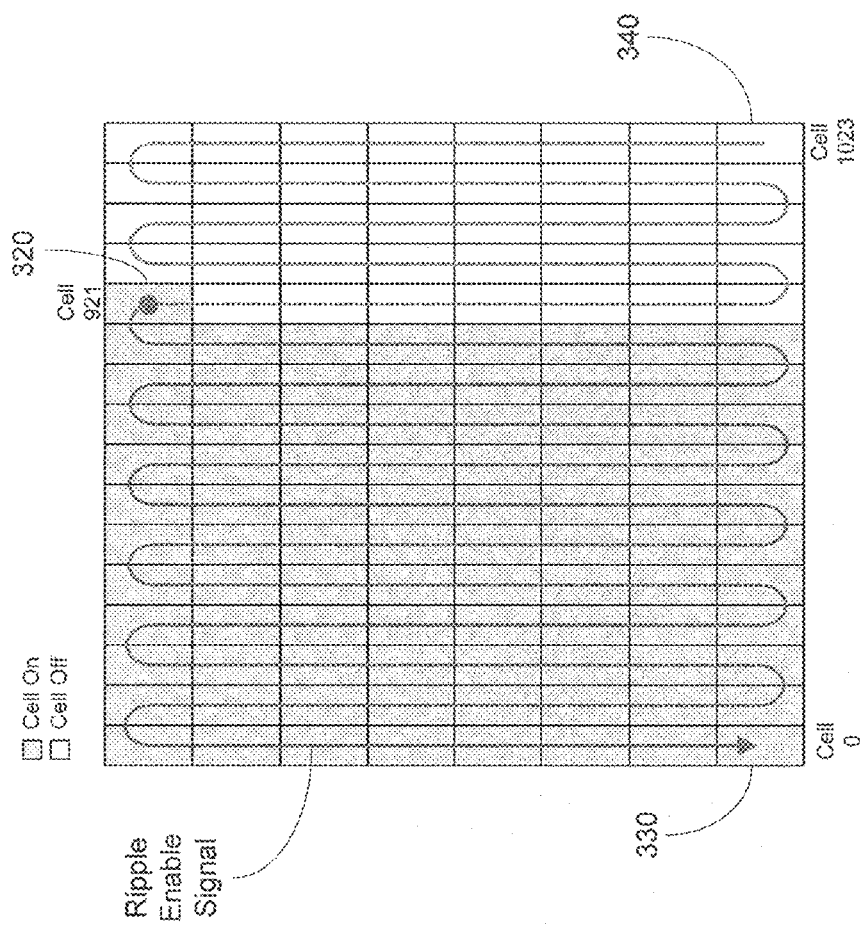
FIG. 5 illustrates an example embodiment of an array of current elements.
Figure 6:
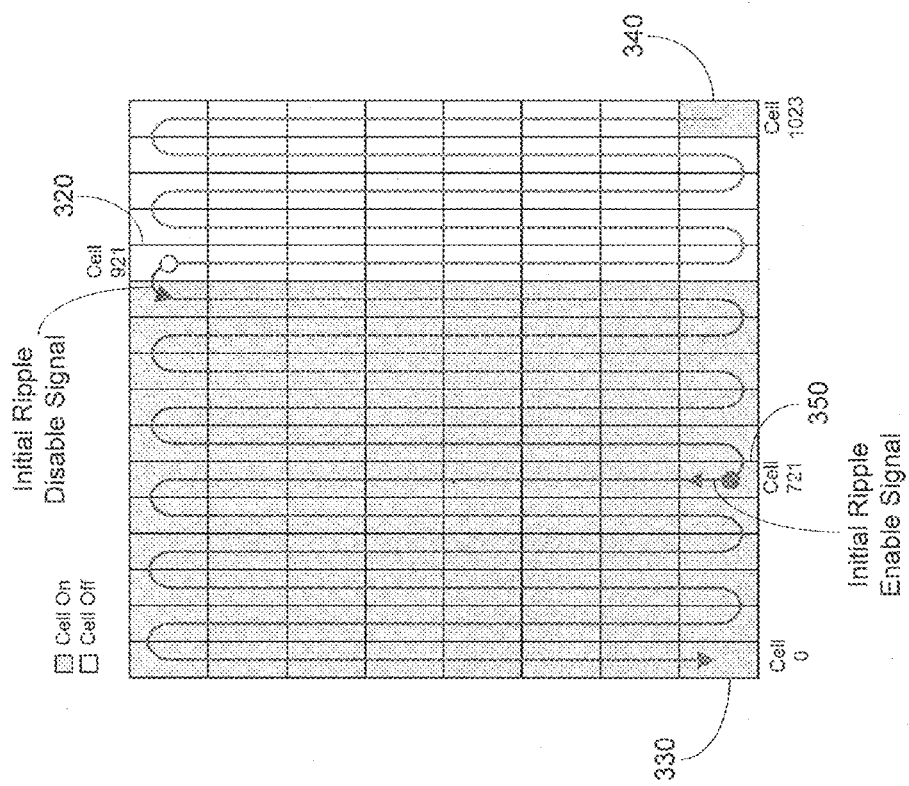
FIG. 6 illustrates an example embodiment of an array of current elements.
Figure 7:
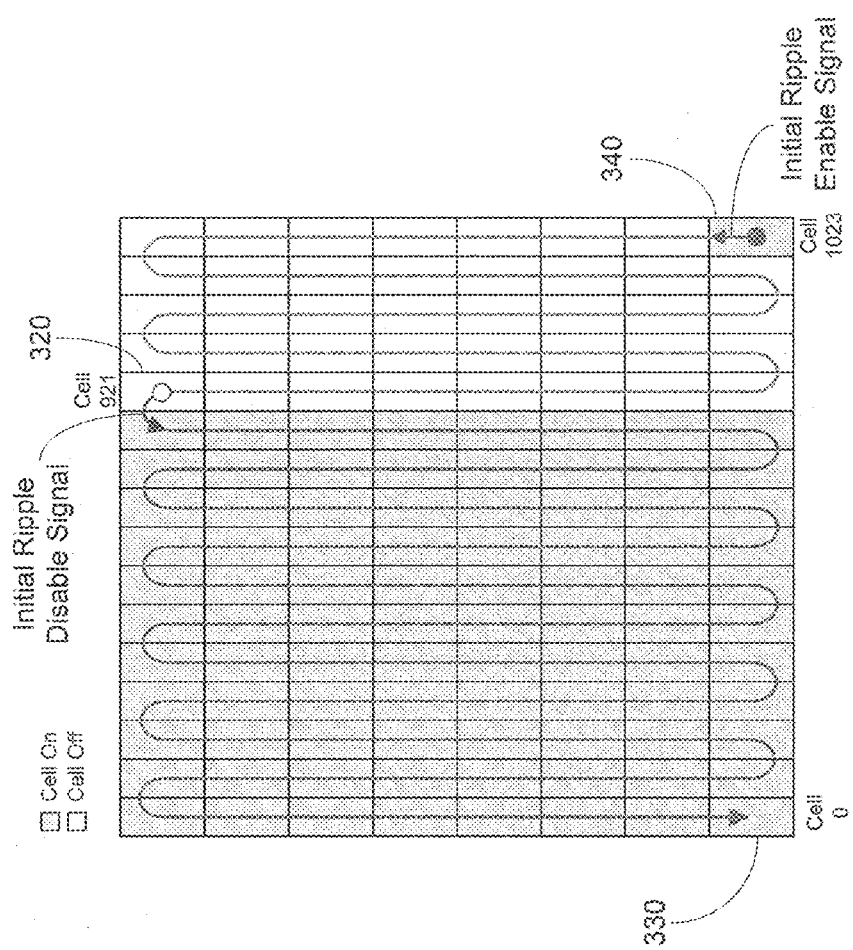
FIG. 7 illustrates an example embodiment of an array of current elements.

FIGS. 5-7 illustrate an example embodiment in which a condition for monotonicity is demonstrated. FIG. 5 illustrates the result when the code to the decoder arrangement 220 indicates that the lead-most current element is cell 921 of 1024 cells in the array 130 in accordance with an example embodiment. Since cell 921 is turned on, the ripple enable signal that is output by cell 921 will propagate in a snake pattern to cell 0 and turn on all the cells down to cell 0.

FIG. 6 illustrates a situation in which the code to the decoder arrangement 220 is reduced such that the code indicates that the lead-most current element is now cell 721 in accordance with an example embodiment. This may occur, for example, when the DAC is stepped down. This will cause cell 721 to send a ripple enable signal in a snake pattern to all the cells down to cell 0. However, since all the cells behind cell 721 were already on from when cell 921 was the lead-most current element, the cells behind cell 721 do not change in their state. When cell 721 is addressed instead of cell 921, cell 921 is de-addressed. In an example embodiment, the de-addressing occurs simultaneously or almost simultaneously. The de-addressing turns off or disables cell 921 and the ripple disable signal is propagated down to cell 721 in a snake pattern. The ripple disable signal output initially by the cell 921 turns off the cells behind cell 921 down to the cell in front of cell 721. Because cell 721 is addressed by the decoder arrangement 220, the ripple disable signal has no effect on its ripple enable signal. In an example embodiment, the total number of active (e.g., cells that are turned on) monotonically decreases. In an example embodiment, the total unit currents output by the array 130 or the DAC 100 decreases monotonically from 921 unit currents to 721 unit currents.

FIG. 7 illustrates a situation in which the code to the decoder arrangement 220 is increased such that the code indicates that the lead-most current element is now cell 1023 in accordance with an example embodiment. This may occur, for example, when the DAC 100 is stepped up. When cell 1023 is addressed and cell 921 is de-addressed, a race condition can occur. Since cell 921 is de-addressed, cell 921 sends a ripple disable signal that propagates toward cell 0 in a snake pattern. Since cell 1023 is addressed, cell 1023 sends a ripple enable signal that propagates toward cell 0 in a snake pattern. However, if the cell-to-cell propagation of the ripple disable signal originating from cell 921 is faster than the cell-to-cell propagation of the ripple enable signal originating from cell 1023, then there is a transient period of time in which more cells are being disable or turned off than are being enabled or turned on. Consequently, even though the DAC 100 was stepped up from cell 921 to cell 1023, for that transient period of time, the number of disabled (e.g., not active or turned off) cells is increasing faster than the number of enabled (e.g., active or turned on) cells. As a net result, for that transient period, the number of active cells and the total current of the DAC 100 decrease even through the DAC 100 was stepped up. Even though the DAC 100 will eventually recover and increase the number of active cells and the total output current, this is a not monotonic behavior since this is not a monotonic increase.

In an example embodiment, to provide monotonicity, the circuitry of the DAC 100 can be configured such that the cell-to-cell propagation time of a ripple enable signal is smaller than the cell-to-cell propagation time of a ripple disable signal.

In an example embodiment, a system or a method can provide for the control of a fully-segmented DAC. The selected lead-most current cell of an array in the digital-to-analog converter is addressed individually using a row/column scheme and a decoder. The remaining current cells behind the lead-most current cell are enabled via a ripple enable signal that propagates backwards from the lead-most current cell. The ripple enable signal snakes through the array to enable all the current cells behind the lead-most current cell in a cell-by-cell fashion. The current cells in front of the lead-most current cell are not enabled.

In an example embodiment, the operation of the address scheme is based on the ordering of the current cells in a monotonic DAC. For a particular setting, the lead-most current cell and all the current cells behind the lead-most cell are active. Once row and column lines are used to address the lead-most current cell at a particular setting, the lead-most current cell alerts the current cell behind it to become active using the ripple enable signal and that operation is performed recursively by all the other current cells that are behind the lead-most cell. When the lead-most current cell is deactivated, a ripple disable signal is sent to the current cell behind it. The ripple disable signal alerts the current cell behind the deactivated lead-most cell to become deactivated. The operation is performed recursively by other current cells behind the lead-most current cell.

In an example embodiment, a DAC can include or work in combination with, for example, one or more processors coupled to one or more memories (e.g., one or more non-transitory computer readable media) via one or more buses. The one or more processors can work in combination with or in place of any of the components and/or elements (e.g., some or all of the components and/or elements) described herein. In an example embodiment, some of the components and/or elements described herein can be part of the one or more processors. Code, software and/or instructions can be stored in the one or more memories or the one or more processors. The code, software and/or instructions can be executed by the one or more processors to perform any of the operations and/or acts or to provide any of the results (e.g., intermediate results) and/or outputs as set forth herein.

While the present method, system and apparatus have been described with reference to certain embodiments, it will be understood by those skilled in the art that various changes may be made and equivalents may be substituted without departing from the scope of the present method and apparatus. In addition, many modifications may be made to adapt a particular situation or material to the teachings of the present disclosure without departing from its scope. Therefore, it is intended that the present method and apparatus not be limited to the particular embodiment disclosed, but that the present method and apparatus will include all embodiments falling within the scope of the appended claims.

What is claimed is:
1. A device, comprising:
a plurality of current elements; and
a decoder operatively coupled to the plurality of current elements,
wherein the decoder activates current elements in a subset of the plurality of current elements by selecting a single current element, wherein each of the activated current elements of the subset and the single current element provides a respective unit current as part of a total current of the device, and wherein the selection of the single current element causes the current elements of the subset to activate in series due to a propagation of a ripple enable signal between adjacent current elements of the subset, wherein the ripple enable signal propagates in a single pattern that extends over a plurality of columns and a plurality of rows.

2. The device according to claim 1, wherein the decoder is involved in turning on only one current element in the device, and wherein the output of the device includes units of current from the single current element and the subsequently activated current elements.

3. The device according to claim 1, wherein each of the current elements of the device comprises respective circuitry that determines which one of the other current elements is to be activated to provide a respective unit of current to the output of the device.

4. The device according to claim 1, wherein the single current element, and the subsequently activated current elements form a snake pattern.

5. The device according to claim 1, wherein the decoder comprises a one-hot column decoder and a one-hot row decoder.

6. The device according to claim 1, wherein each current element comprises respective logic that enables the respective current element if the respective current element is selected by the decoder and that enables the respective current element if the respective current element is activated by another current element.

7. The device according to claim 1, wherein each current element comprises respective circuitry that provides monotonicity for the device.

8. The device according to claim 1, wherein the single pattern is a snake pattern in which the ripple enable signal propagates.

9. The device according to claim 8, wherein a ripple disable signal propagates in series in the snake pattern, wherein the ripple disable signal causes each current element that receives the ripple disable signal to not provide the respective unit current to the total current of the device.

10. The device according to claim 9, wherein the ripple enable signal propagates faster through the elements than the ripple disable signal.

11. The device according to claim 9, wherein the ripple disable signal and the ripple enable signal propagate unidirectionally in the snake pattern.

12. A method of providing an output signal by a digital-to-analog converter comprising:

selecting, by a decoder, a first current element in a subset of current elements in the digital-to-analog converter that enables the first current element to provide a first current;

selecting, by circuitry in the first current element, a second current element in the subset of the current elements that enables the second current element to provide a second current;

selecting other current elements in the subset of the current elements by propagation of a ripple enable signal between adjacent current elements of the subset, wherein the ripple enable signal propagates in a single pattern that extends over a plurality of columns and a plurality of rows; and summing up the first current, the second current and the respective currents from the other selected current elements to provide an output signal of the digital-to-analog converter.

13. The method according to claim 12, comprising:

forming a snake pattern from the daisy chain sequence of current element selections.

14. The method according to claim 12, comprising:

selecting and enabling only one current element by the decoder for the output signal, wherein the one current element selected and enabled by the decoder is the first current element.

15. The method according to claim 12, wherein respective circuitry in each current element of the digital-to-analog converter is configured to select and enable one other current element.

16. The method according to claim 12, comprising:

configuring the decoder to provide a one-hot column decoder and a one-hot row decoder.

17. The method according to claim 12, comprising:

providing monotonicity for the digital-to-analog converter.

18. The method according to claim 12, comprising:

individually addressing each of the current elements of the digital-to-analog converter.

19. The method according to claim 12, comprising:

fully segmenting the digital-to-analog converter into a plurality of the current elements that are arranged over the plurality of columns and the plurality of rows.

* * * * *